United States Patent
Xiong et al.

(10) Patent No.: US 10,649,589 B2
(45) Date of Patent: May 12, 2020

(54) TOUCH APPARATUS, ELECTRONIC DEVICE AND PREPARING METHOD

(71) Applicants: SHANGHAI TIANMA AM-OLED CO., LTD., Shanghai (CN); TIANMA MICRO-ELECTRONICS CO., LTD., Shenzhen (CN)

(72) Inventors: Zhiyong Xiong, Shanghai (CN); Fangyun Lin, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/622,022

(22) Filed: Jun. 13, 2017

(65) Prior Publication Data

US 2017/0277310 A1 Sep. 28, 2017

(30) Foreign Application Priority Data

Oct. 28, 2016 (CN) .......................... 2016 1 0970032

(51) Int. Cl.
*G06F 3/044* (2006.01)
*G06F 1/16* (2006.01)
*H05K 1/02* (2006.01)

(52) U.S. Cl.
CPC ............ *G06F 3/044* (2013.01); *G06F 1/1652* (2013.01); *H05K 1/028* (2013.01); *G06F 2203/04102* (2013.01)

(58) Field of Classification Search
CPC .... G06F 1/1652; G06F 3/0412; G06F 3/0416; G06F 3/044; G09G 3/043

(Continued)

(56) References Cited

U.S. PATENT DOCUMENTS

| 2015/0008115 A1 | 1/2015 | Tian |
| 2015/0193065 A1* | 7/2015 | Hsieh .................... G06F 3/0412 345/174 |

(Continued)

FOREIGN PATENT DOCUMENTS

| CN | 102799313 A | 11/2012 |
| CN | 203311375 U | 11/2013 |

(Continued)

OTHER PUBLICATIONS

Second Office Action for CN Appln. No. 201610970032.3 dated Mar. 25, 2019, 17 pages.

(Continued)

*Primary Examiner* — Dennis P Joseph
(74) *Attorney, Agent, or Firm* — Kilpatrick Townsend & Stockton, LLP

(57) ABSTRACT

A touch apparatus, an electronic device, and a method for preparing the touch apparatus are provided. The touch apparatus includes: a substrate and a cover plate arranged opposite to each other, a first touch sensor, and a second touch sensor. The substrate includes a display region including a first display region and a second display region arranged in a first direction. The first touch sensor is arranged on the side of the cover plate towards the substrate. The second touch sensor is arranged on the side of the substrate towards the cover plate. The second touch sensor is arranged in a different layer from the first touch sensor. The first touch sensor has a first projection on the substrate in a second direction, which covers the first display region. The second touch sensor has a second projection on the substrate in the second direction, which covers the second display region.

16 Claims, 17 Drawing Sheets

(58) Field of Classification Search
USPC .......................................................... 345/690
See application file for complete search history.

(56) References Cited

U.S. PATENT DOCUMENTS

| | | | |
|---|---|---|---|
| 2015/0241924 A1* | 8/2015 | Chang | ..................... G06F 3/044 349/12 |
| 2016/0179262 A1 | 6/2016 | Li et al. | |
| 2016/0179268 A1 | 6/2016 | Hong | |
| 2017/0315645 A1* | 11/2017 | Park | ..................... G06F 3/0412 |

FOREIGN PATENT DOCUMENTS

| | | |
|---|---|---|
| CN | 203552211 U | 4/2014 |
| CN | 104281304 A | 1/2015 |
| CN | 204143398 U | 2/2015 |
| CN | 104597646 A | 5/2015 |
| CN | 105224116 A | 1/2016 |
| TW | 201533624 A | 9/2015 |

OTHER PUBLICATIONS

CN First Office Action dated Oct. 26, 2018 in the corresponding Chinese application(application No. 201610970032.3).

* cited by examiner

US 10,649,589 B2

TOUCH APPARATUS, ELECTRONIC DEVICE AND PREPARING METHOD

CROSS REFERENCE TO RELATED APPLICATION

The present application claims the priority to Chinese Patent Application No. 201610970032.3, titled "TOUCH APPARATUS, ELECTRONIC DEVICE AND PREPARING METHOD", filed on Oct. 28, 2016 with the State Intellectual Property Office of the People's Republic of China, which is incorporated herein by reference in its entirety.

TECHNICAL FIELD

The present disclosure relates to the technical field of electronic device, and in particular to a touch apparatus, an electronic device and a preparing method.

BACKGROUND

With the continuous development of science and technology, an electronic device with a touch display function is more and more widely applied in people's daily life and work, which is convenient for people's daily life and work, and becomes an important and indispensable tool.

A touch sensor is a main component of the electronic device to achieve the touch function. A bendable touch sensor is applicable to more application environments because of the flexibility and portability. Therefore, the bendable touch sensor is a development direction of the touch sensor.

In general, since touch electrodes in the touch sensor are made of metal or Indium Tin Oxides (ITO), the touch electrodes tend to break up when the touch sensor is bent, which results in a low lifespan of the touch sensor.

SUMMARY

To solve the above problems, a touch apparatus, an electronic device and a preparing method are provided according to embodiments of the present disclosure. The touch apparatus includes two touch sensors to facilitate bending and improve a lifespan of the touch sensor.

To achieve the above objects, the following technical solutions are provided according to the present disclosure.

A touch apparatus is provided according to the present disclosure. The touch apparatus includes a substrate, a cover plate, a first touch sensor, and a second touch sensor.

The substrate and the cover plate are arranged opposite to each other. The substrate includes a display region, and the display region includes a first display region and a second display region arranged in a first direction.

The first touch sensor is arranged on the side of the cover plate towards the substrate.

The second touch sensor is arranged on the side of the substrate towards the cover plate. The second touch sensor is arranged in a different layer from the first touch sensor.

The first direction is parallel to the substrate. The first touch sensor has a first projection on the substrate in a second direction, and the first projection covers the first display region. The second touch sensor has a second projection on the substrate in the second direction, and the second projection covers the second display region. The second direction is perpendicular to the substrate.

An electronic device is further provided according to the present disclosure. The electronic device includes the above touch apparatus.

A preparing method is further provided according to the present disclosure to prepare the above touch apparatus. The preparing method includes:

providing a substrate and a cover plate, where the substrate includes a display region, and the display region includes a first display region and a second display region arranged in a first direction;

forming a first touch sensor on a surface of the cover plate, and forming a second touch sensor on a surface of the substrate; and attaching the cover plate to the substrate, where the side of the cover plate provided with the first touch sensor is arranged opposite to the side of the substrate provided with the second touch sensor, and the second touch sensor is arranged in a different layer from the first touch sensor.

The first direction is parallel to the substrate. The first touch sensor has a first projection on the substrate in a second direction, and the first projection covers the first display region. The second touch sensor has a second projection on the substrate in the second direction, and the second projection covers the second display region. The second direction is perpendicular to the substrate.

A preparing method is further provided according to the present disclosure to prepare the above touch apparatus. The preparing method includes:

providing a substrate and a cover plate;

forming a first touch sensor on a side of the cover plate;

forming a first insulating layer, which covers at least a part of the first touch sensor;

preparing a second touch sensor on the cover plate on which the first insulation layer is formed, where the first insulating layer electrically insulates the first touch sensor from the second touch sensor; and attaching the substrate to the side of the cover plate prepared with the second touch sensor.

The first direction is parallel to the substrate. The first touch sensor has a first projection on the substrate in a second direction, and the first projection covers the first display region. The second touch sensor has a second projection on the substrate in the second direction, and the second projection covers the second display region. The second direction is perpendicular to the substrate.

BRIEF DESCRIPTION OF THE DRAWINGS

To illustrate technical solutions according to embodiments of the present disclosure or in the conventional technologies more clearly, drawings to be used in the descriptions of the embodiments or the conventional technologies are described briefly hereinafter. Apparently, the drawings described hereinafter are only for some embodiments of the present disclosure, and other drawings may be obtained by those skilled in the art based on those drawings without creative efforts.

DETAILED DESCRIPTION OF THE EMBODIMENTS

Technical solutions of the embodiments are illustrated clearly and completely in conjunction with the drawings of the embodiments. Apparently, the described embodiments are merely a few rather than all of the embodiments of the present disclosure. All other embodiments obtained by those skilled in the art based on the embodiments without creative efforts shall fall within the protection scope of the present disclosure.

As described in the background, in a conventional touch sensor, a touch electrode is generally made of metal or ITO. If a touch sensor is bent, the touch electrode will be deformed at the bending position, which causes the touch electrode to be easily broken at the bent portion, and results in a low service life of the touch sensor.

To solve the above problems, a touch apparatus is provided according to the present disclosure. The touch apparatus includes a substrate, a cover plate, a first touch sensor and a second touch sensor.

The substrate and the cover plate are arranged opposite to each other. The substrate includes a display region, and the display region includes a first display region and a second display region arranged in a first direction.

The first touch sensor is arranged on the side of the cover plate towards the substrate.

The second touch sensor is arranged on the side of the substrate towards the cover plate. The second touch sensor is arranged in a different layer from the first touch sensor.

The first direction is parallel to the substrate. The first touch sensor has a first projection on the substrate in a second direction, and the first projection covers the first display region. The second touch sensor has a second projection on the substrate in the second direction, and the second projection covers the second display region. The second direction is perpendicular to the substrate.

In the touch display device according to the present disclosure, the first touch sensor and the second touch sensor are arranged in a separate manner in the display region. In such way, when the touch apparatus is bent at the junction of the first display region and the second display region is bent, the touch electrode can be prevented from being broken, which improves the service life. In addition, the first touch sensor is arranged in a different layer from the second touch sensor, and wires of the first touch sensor may overlap wires of the second touch sensor in the second direction, which facilitates the wire layout of the first touch sensor and the second touch sensor and saves wire space.

To make the technical solutions provided by the present disclosure clearer, hereinafter the above solutions are described in detail in conjunction with drawings.

Figure 1:
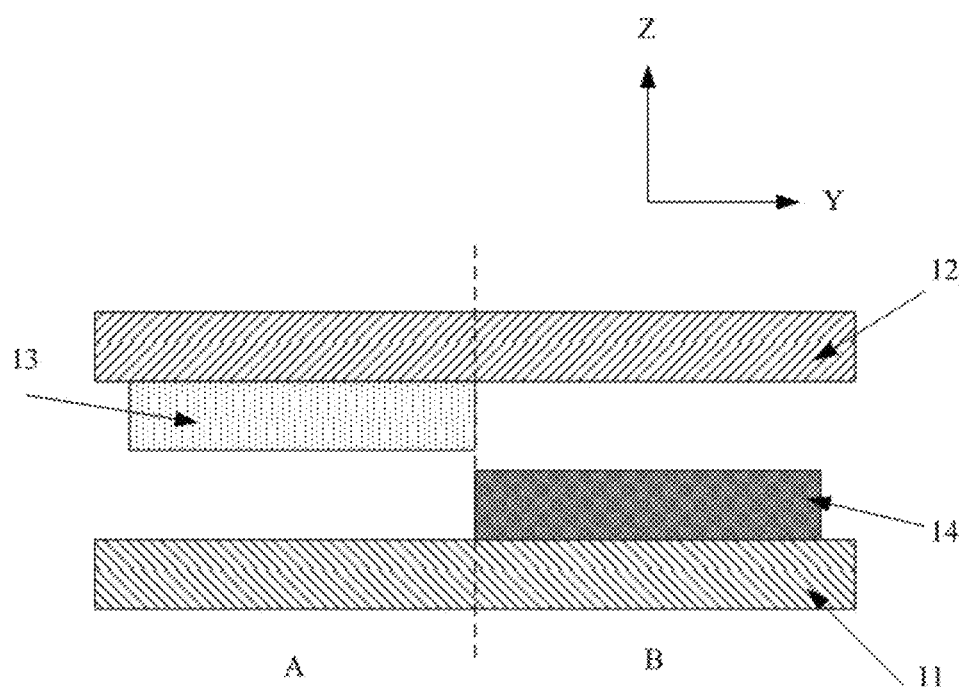
FIG. 1 is a schematic structural diagram of a touch apparatus according to the present disclosure.

Reference is made to FIG. 1, which is a schematic structural diagram of a touch apparatus according to the present disclosure. The touch apparatus includes a substrate 11, a cover plate 12, a first touch sensor 13, and a second touch sensor 14. The substrate 11 and the cover plate 12 are arranged opposite to each other. The substrate 11 is includes a display region, and the display region includes a first display region A and a second display region B arranged in a first direction Y. The first touch sensor 13 is arranged on the side of the cover plate 12 towards the substrate 11. The second touch sensor 14 is arranged on the side of the substrate 11 towards the cover plate 12. The second touch sensor 14 is arranged in a different layer from the first touch sensor 13.

The first direction Y is parallel to the substrate 11. The first touch sensor 13 has a first projection on the substrate 11 in a second direction Z, and the first projection covers the first display region A. The second touch sensor 14 has a second projection on the substrate 11 in the second direction, and the second projection covers the second display region B. The second direction Z is perpendicular to the substrate 11.

The junction of the first display region A and the second display region B is a straight line. The touch apparatus may be bent along the junction of the first display region A and the second display region B. To have a good bending performance of the touch apparatus, each of the cover plate 12 and the substrate 11 may be flexible plate. The flexible plate may be PET (polyethylene terephthalate), or a PET substrate, or a COP (cyclic olefin copolymer) substrate.

In the second direction Z, the first touch sensor 13 may be not overlapped, or be partially overlapped with the second touch sensor 14.

Figure 2:
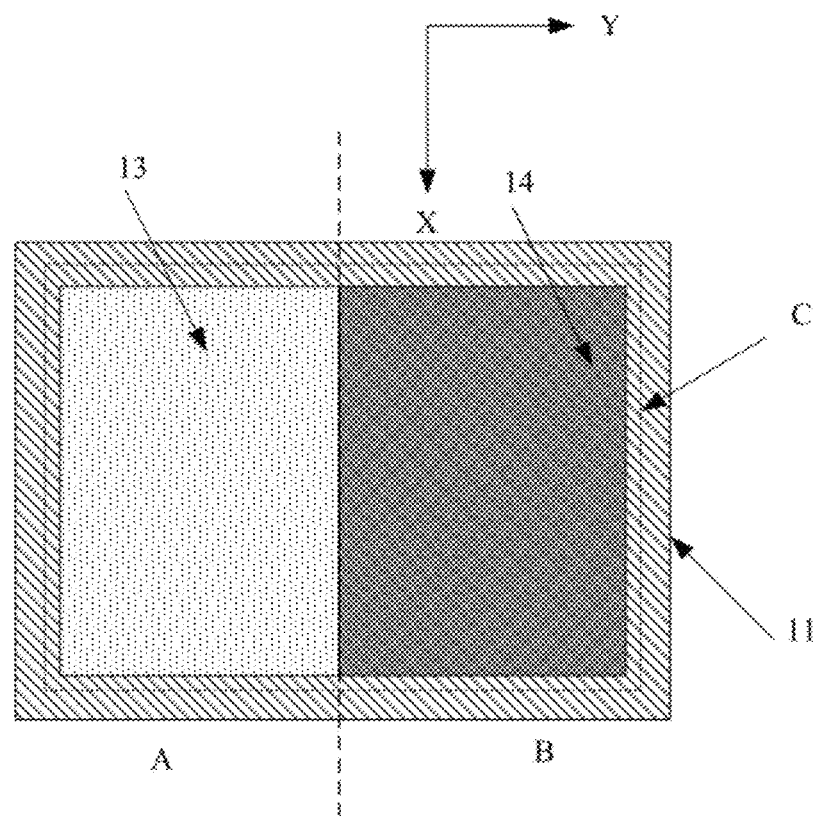
FIG. 2 is a schematic diagram of a relative position relation of two touch sensors of a touch apparatus according to the present disclosure.

In a case that the first touch sensor 13 and the second touch sensor 14 are not overlapped, the structure of the touch apparatus may be as shown in FIG. 2, which is a schematic diagram of a relative position relation of two touch sensors of a touch apparatus according to the present disclosure.

In the embodiment as shown in FIG. 2, the first projection of the first touch sensor 13 on the substrate 11 is completely located in the first display region A, and the second projection of the second touch sensor 14 on the substrate 11 is completely located in the second display region B. The sum of the areas of the first projection and the second projection is equal to the area of the display region C.

In the embodiment as shown in FIG. 2, there is no touch dead zone between the first touch sensor 13 and the second touch sensor 14, having a high touch detection accuracy.

It should be noted that, in the present disclosure, a third direction X is parallel to the substrate 11 and is perpendicular to the first direction Y. The first direction Y, the second direction Z, and the third direction X are three corresponding coordinate axes of an XYZ rectangular coordinate system.

Figure 3:
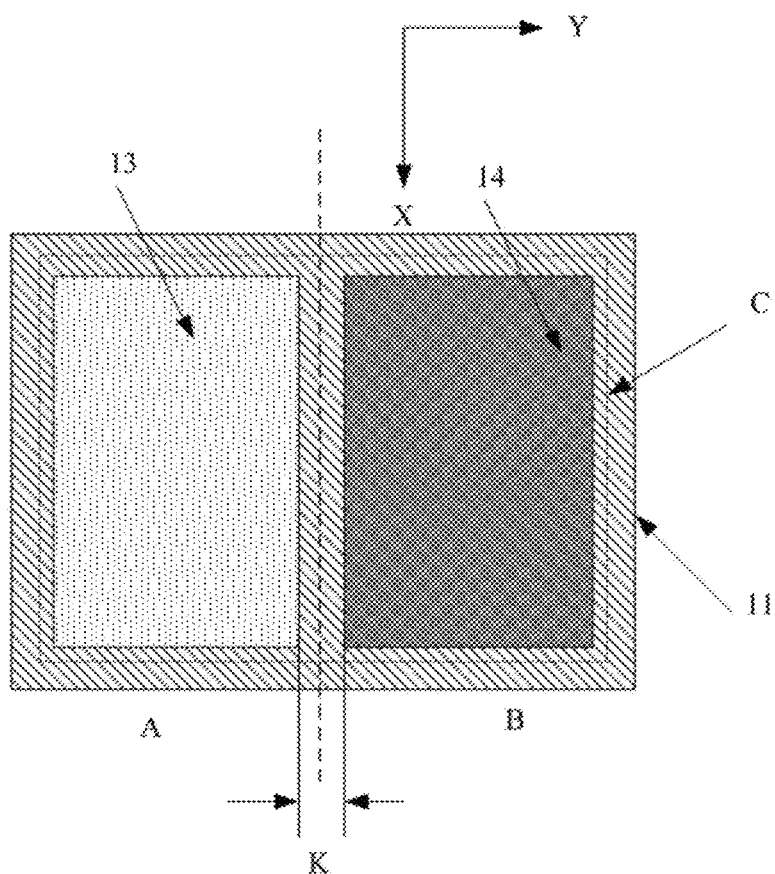
FIG. 3 is a schematic diagram of a relative position relation of two touch sensors of a touch apparatus according to the present disclosure.

In the second direction Z, in a case that the first touch sensor 13 and the second touch sensor 14 are not overlapped, the structure of the touch apparatus may be as shown in FIG. 3, which is a schematic diagram of a relative position relation of two touch sensors of a touch apparatus according to the present disclosure. In the embodiment shown in FIG. 3, the first projection of the first touch sensor 13 on the substrate 11 is completely located in the first display region A, and the second projection of the second touch sensor 14 on the substrate 11 is completely located in the second display region B. A gap K with a preset width in the first direction Y exists between the first projection and the second projection. The width of the gap K in the first direction Y is not greater than 10 μm.

If the first touch sensor 13 and the second touch sensor 14 are arranged in the same layer in the second direction Z, a gap with a larger width should be designed between the first touch sensor 13 and the second touch sensor 14 to achieve the insulation between them, which may seriously affect the accuracy of touch detection.

In the embodiment as shown in FIG. 3, since the first touch sensor 13 and the second touch sensor 14 are not arranged in the same layer in the second direction Z, the insulation between the first touch sensor 13 and the second touch sensor 14 can be achieved via the gap K having a width in the first direction Y not greater than 10 μm, which makes the touch apparatus have a good touch detection accuracy meeting application requirements with a sufficient width of the gap K between the first touch sensor 13 and the second touch sensor 14. Specifically, the width of the gap K may be 2 mm, or 5 μm. With such position design, there is no need to perform a highly precise position calibration on the two touch sensors, and there is no touch dead zone.

Figure 4:
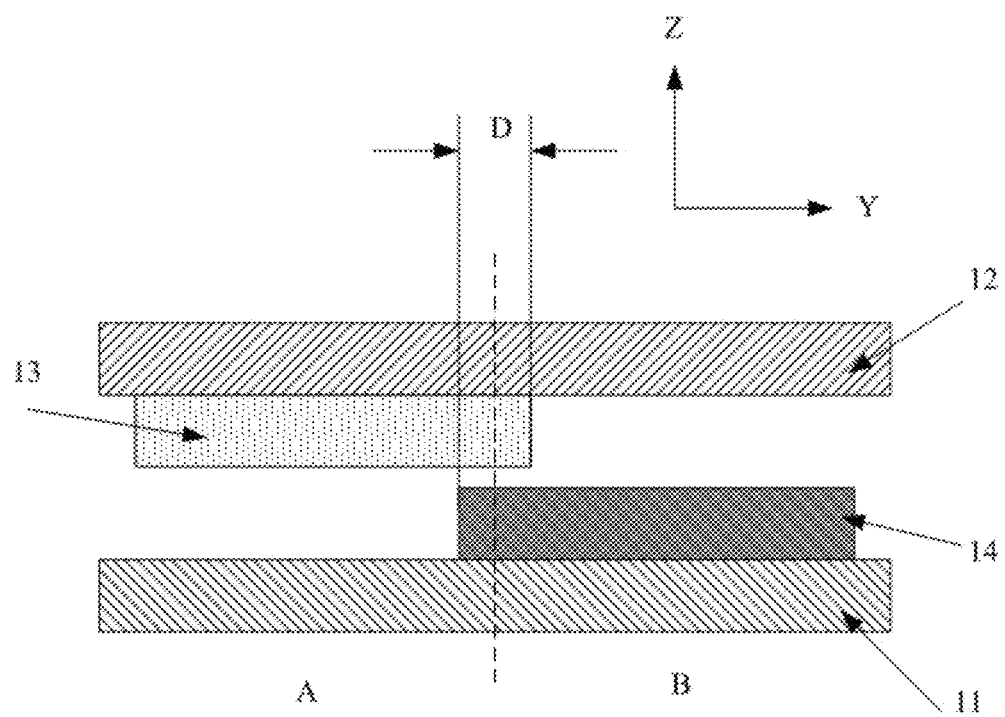
FIG. 4 is a schematic structural diagram of a touch apparatus according to the present disclosure.

In the second direction Z, in a case that the first touch sensor 13 and the second touch sensor 14 are partially overlapped, the structure of the touch apparatus may be as shown in FIG. 4, which is a schematic structural diagram of a touch apparatus according to the present disclosure. As shown in FIG. 4, the first projection of the first touch sensor 13 on the substrate 11 and the second projection of the second touch sensor 14 on the substrate 11 have an overlapping portion D with a preset width in the first direction Y. Specifically, the width of the overlapping portion D in the first direction Y is not greater than 10 μm. As shown in FIG. 4, the two touch sensors are designed to be partially overlapped, there is no need to perform a highly precise position calibration, and there is no touch dead zone.

Figure 5:
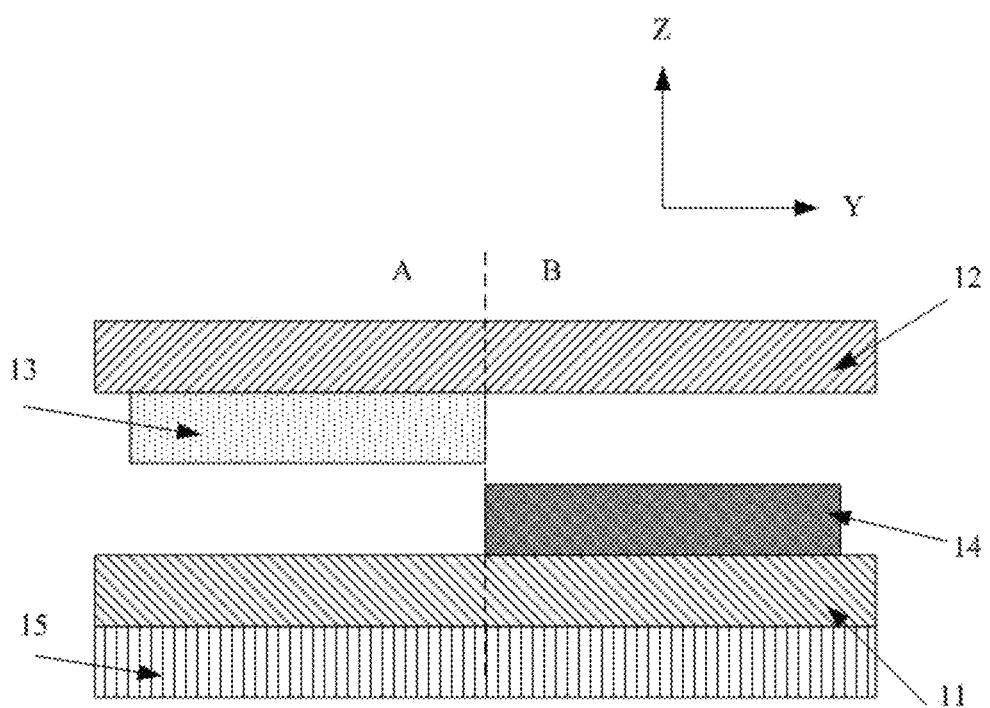
FIG. 5 is a schematic structural diagram of a touch apparatus according to the present disclosure.

Reference is made to FIG. 5, which is a schematic structural diagram of a touch apparatus according to the present disclosure. On the basis of the embodiment as shown in FIG. 1, the touch apparatus as shown in FIG. 5 further includes a flexible display panel 15. The flexible display panel 15 is attached to the substrate 11. Specifically, the flexible display panel 15 is arranged on the side of the substrate 11 facing away from the cover plate 12. In the touch apparatus, the first touch sensor 13 and the second touch sensor 14 may be prepared separately from the flexible display panel 15.

Figure 6:
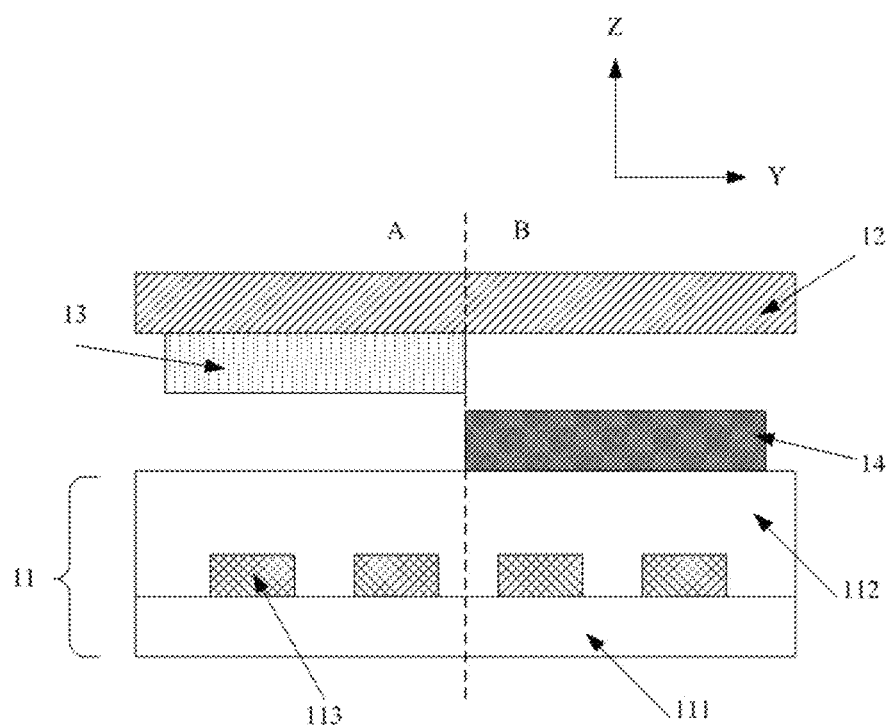
FIG. 6 is a schematic structural diagram of a touch apparatus according to the present disclosure.

In the present disclosure, the substrate 11 may be a flexible display substrate. The structure of the substrate 11 may be as shown in FIG. 6, which is a schematic structural diagram of a touch apparatus according to the present disclosure. On the basis of the touch apparatus as shown in FIG. 1, for the touch apparatus as shown in FIG. 6, the substrate 11 is a flexible display substrate, and the flexible display substrate includes multiple pixel units 113 arranged in an array. The flexible display substrate further includes a flexible back plate 111 and an encapsulation layer 112. The multiple pixel units 113 are arranged on the side of the flexible back plate 111 towards the cover plate 12, and the encapsulation layer 112 covers all of the multiple pixel units 113. The second touch sensor 14 is arranged on the side of the encapsulation layer 112 towards the cover plate 12.

Figure 7:
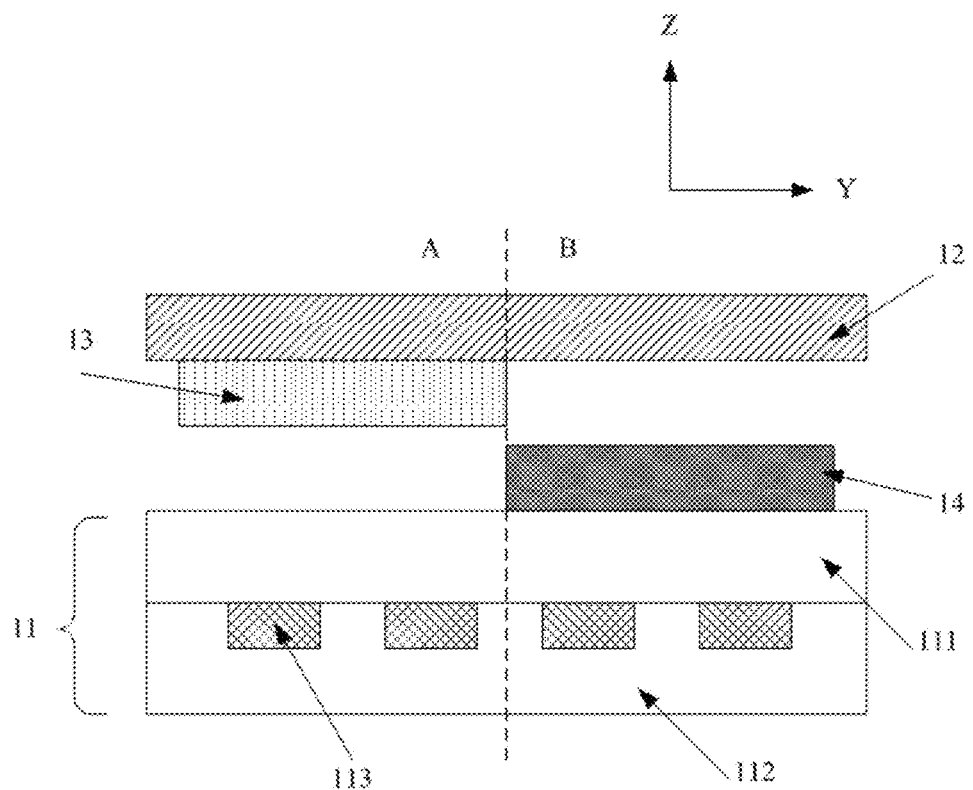
FIG. 7 is a schematic structural diagram of a touch apparatus according to the present disclosure.

In a case that the substrate 11 is a flexible display substrate, the structure of the touch apparatus may also be as shown in FIG. 7, which is a schematic structural diagram of a touch apparatus according to the present disclosure. On the basis of the touch apparatus as shown in FIG. 1, for the touch apparatus as shown in FIG. 7, the substrate 11 is also a flexible display substrate. The embodiment shown in FIG. 7 differs from that in FIG. 6 in that, the flexible back plate 111 in FIG. 7 is arranged towards the cover plate 12, and the second touch sensor 14 is arranged on the side of the flexible back plate 111 towards the cover plate 12. Pixel units 113 are arranged on the side of the flexible back plate 111 facing away from the cover plate 12. The encapsulation layer 112 covers all the pixel units 113.

In the embodiments as shown in FIG. 6 and FIG. 7, the flexible display substrate directly severs as the substrate of the second touch sensor, which can reduce the thickness of the touch apparatus and simplify the fabrication process.

In the present disclosure, each of the first touch sensor 13 and the second touch sensor 14 is provided with an independent control chip. In the above embodiments, since the first touch sensor 13 and the second touch sensor 14 are in different layers in the second direction Z, sensing distances are different, and detected signal intensities are different, which results in a detection difference between the two touch sensors. In the present disclosure, separate control chips are provided to perform independent touch detection control on the two touch sensors, which can avoid the detection difference between the two touch sensors.

Figure 8:
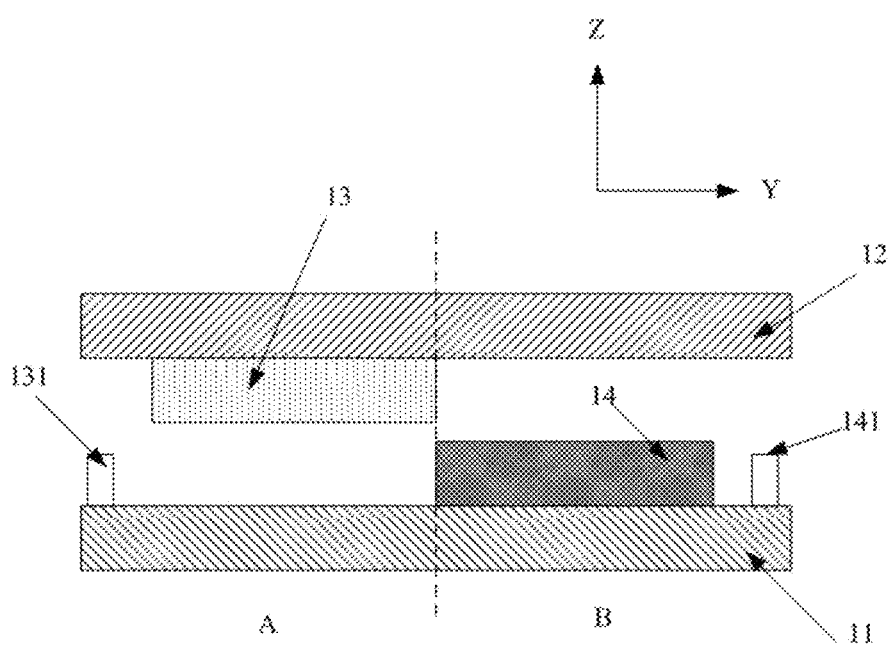
FIG. 8 is a schematic structural diagram of a touch apparatus according to the present disclosure.
Figure 9:
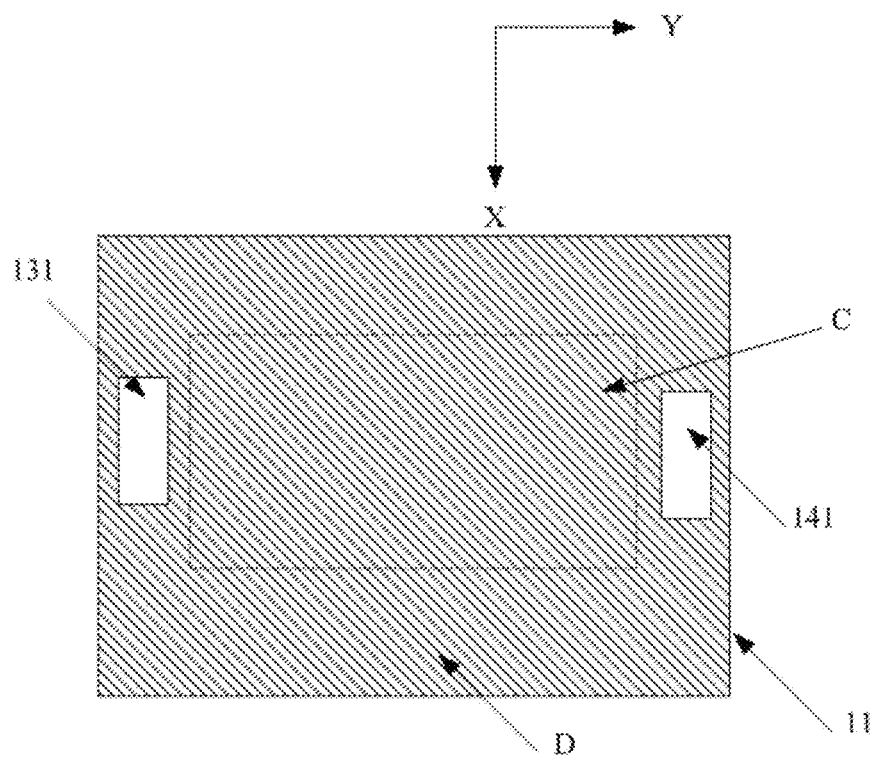
FIG. 9 is a top view of a substrate in a touch apparatus as shown in FIG. 8.

In the present disclosure, in a case that each of the two touch sensors is provided with an independent control chip, the structure of the touch apparatus may be as shown in FIG. 8 and FIG. 9, FIG. 8 is a schematic structural diagram of a touch apparatus according to the present disclosure. FIG. 9 is a top view of a substrate in the touch apparatus shown in FIG. 8. On the basis of FIG. 1, the touch apparatus further includes a control chip 131 for the first touch sensor 13 and a control chip 141 for the second touch sensor 14.

The substrate 11 further includes a frame region D surrounding the display region C. Both the control chip 131 for the first touch sensor 13 and the control chip 141 for the second touch sensor 14 are arranged in the frame region D. The two control chips in FIG. 9 are both arranged in the frame region D corresponding to two opposite sides of the display region C. Positions of the two chips includes, but not limited to the positions shown in FIG. 9. The two control chips may further arranged in the frame region D corresponding to the two adjacent sides of the display region C.

The first touch sensor 13 and the second touch sensor 14 are electrically connected to their corresponding control chips through a flexible circuit board. Specifically, the first touch sensor 13 may be electrically connected to the control chip 131 through the corresponding flexible circuit board. The second touch sensor 14 may be electrically connected to the control chip 141 through the corresponding flexible circuit board. Since the second touch sensor and the control chip 141 are located on the same surface of the substrate 11, the second touch sensor 14 may also be electrically connected to the control chip 141 directly through conductive wires formed on the surface of the substrate 11.

Figure 10:
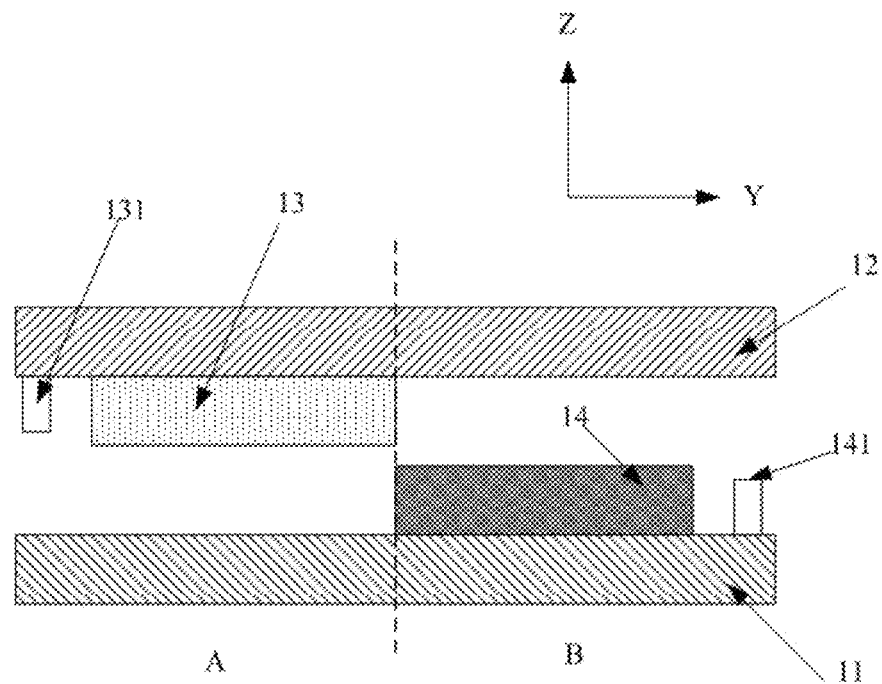
FIG. 10 is a schematic structural diagram of a touch apparatus according to the present disclosure.

In the present disclosure, in a case that each of the two touch sensors of the touch apparatus is provided with an independent control chip, the structure of the touch apparatus may be as shown in FIG. 10, which is a schematic structural diagram of a touch apparatus according to the present disclosure. In this case, the control chip 131 for the first touch sensor 13 is arranged on a surface of the cover plate 12 towards the substrate 11, and the control chip 141 for the second touch sensor 14 is arranged on a surface of the substrate 11 towards the cover plate 12. The control chip 141 is located in the frame region. In the second direction Z, the projection of the control chip 131 on the substrate 11 is located in the frame region.

Figure 11:
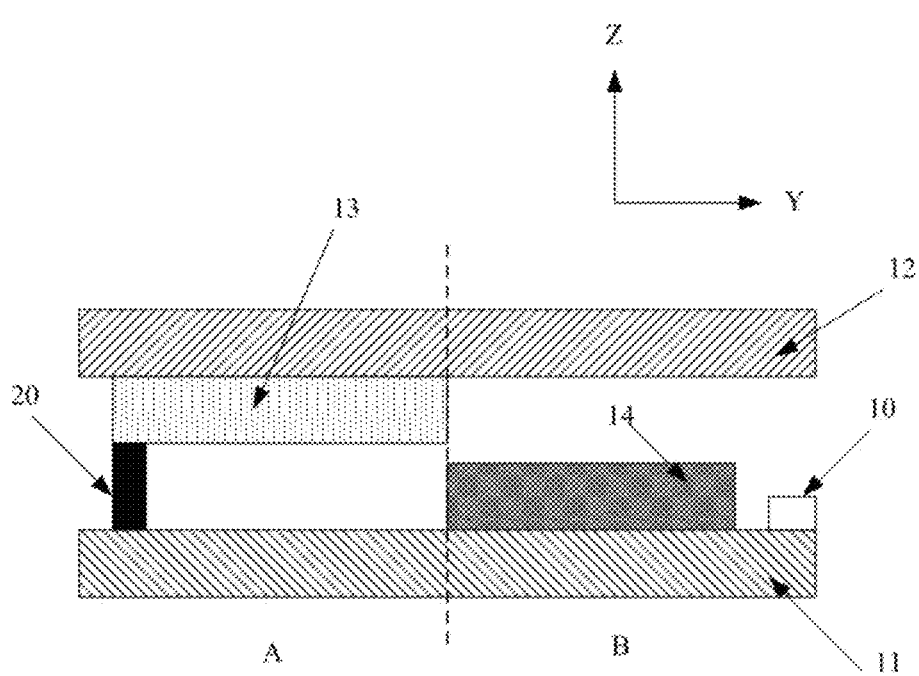
FIG. 11 is a schematic structural diagram of a touch apparatus according to the present disclosure.

In the present disclosure, the two touch sensors of the touch apparatus may have the same control chip. In this case, the structure of the touch apparatus is as shown in FIG. 11, which is a schematic structural diagram of a touch apparatus according to the present disclosure. On the basis of the embodiment as shown in FIG. 1, the touch apparatus as shown in FIG. 11 further includes a control chip 10. The control chip 10 is arranged in the frame region of the substrate 11. In this case, the first touch sensor 13 and the second touch sensor 14 share the same control chip 10. A conductive member 20 is arranged between the substrate 11 and the cover plate 12. The conductive member 20 electrically connects the first touch sensor 13 to the substrate 11. The first touch sensor 13 and the second touch sensor 14 are electrically connected to the control chip 10 through the conductive wires arranged on the substrate 11.

In a case that the two touch sensors share the same control chip 10, the two touch sensors have a difference in the touch detection due to a height difference between the two touch sensors in the second direction Z. Specifically, the second touch sensor 14 needs a higher sensing precision than the first touch sensor 13, and thus the sensing precision of the control chip may be set to be not lower than the minimum sensing precision of the second touch sensor 14. In such way, in the touch detection, the first touch sensor 13 can sense any touch operation detectable to the second touch sensor 14, thereby eliminating the difference in touch detection caused by the height difference between the two touch sensors.

In a case that the substrate 11 is an OLED display panel, there are multiple pixel units arranged in an array. Each of the multiple pixel units is an OLED device. The OLED device includes an anode arranged on the surface of the back plate, a light emitting functional layer arranged on the back side of the anode, and a cathode arranged on the light emitting functional layer.

In the embodiment as shown in FIG. 11, the conductive member 20 may be conductive glue. The first touch sensor 13 is electrically connected to the conductive wires on the surface of the substrate 11 via the conductive glue directly, and thereby electrically connected to the control chip 10. In a case that the substrate 11 is an OLED display panel, the conductive wires connected to the conductive member 20 may be prepared in the same conductive layer as the anode of the OLED display panel.

Figure 12:
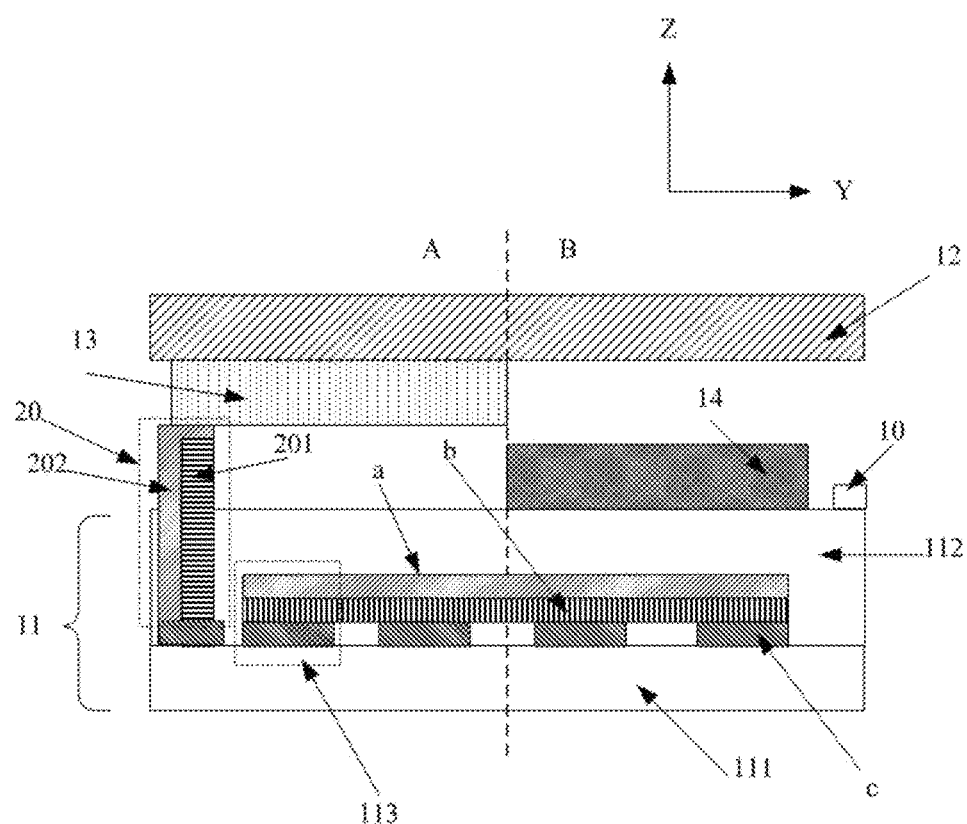
FIG. 12 is a schematic structural diagram of a touch apparatus according to the present disclosure.

In a case that the substrate 11 is an OLED display panel, the structure of the touch apparatus may be further as shown in FIG. 12, which is a schematic structural diagram of a touch apparatus according to the present disclosure. On the basis of the embodiment as shown in FIG. 6, the touch apparatus as shown in FIG. 12 further includes a control chip 10. The control chip 10 is arranged in the frame region of the substrate 11. In this case, the first touch sensor 13 and the second touch sensor 14 share the same control chip 10. A conductive member 20 is provided between the substrate 11 and the cover plate 12. The conductive member 20 electrically connects the first touch sensor 13 to the substrate 11. The OLED includes a flexible back plate 111 and multiple pixel units 113 arranged on the side of the flexible back plate III towards the cover plate 12. Each of the multiple pixel units 113 is an OLED device. The OLED device includes an anode c and a cathode a which are arranged opposite to each other, and a light emitting layer b arranged between the anode c and the cathode a. The cathode b of each OLED device is a unitary structure, and the light emitting layer h of each OLED device is a unitary structure. The anodes c of the OLED devices are arranged in an array independently.

The first touch sensor 13 and the second touch sensor 14 are electrically connected to the control chip 10 through the conductive wires arranged on the substrate 11. The wires and the anode c are prepared in the same conductive layer. The conductive member 20 includes a support column 201 and a connection layer 202 arranged on the surface of the support column 201. The connection layer 202 and the cathode a are prepared in the same conductive layer. In the embodiment, the support column 201 also serves as a support for the conductive member 20, which can reduce the usage of the conductive material and reduce the cost.

Figure 13:
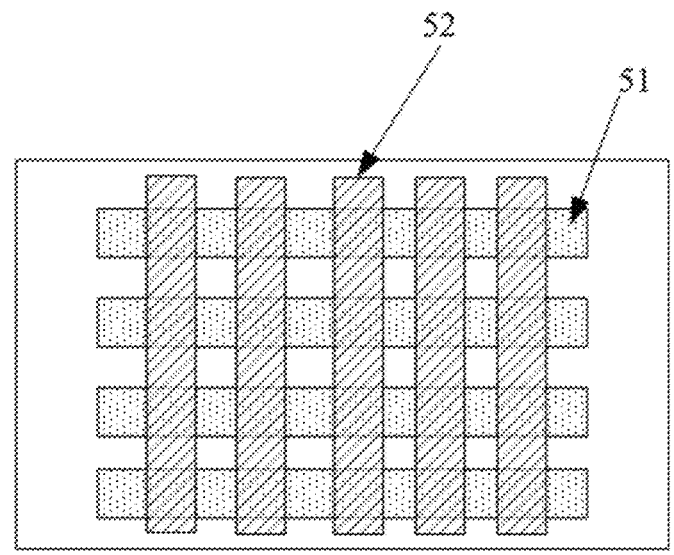
FIG. 13 is a schematic structural diagram of an electrode of a touch sensor according to the present disclosure.

In another embodiment, in a case that the substrate 11 is an OLED display panel, the conductive member 20, via which the first touch sensor 13 is connected to the wires on the surface of the substrate 11, may be constituted by a cathode metal layer. In this case, the cathode metal layer completely serves as the conductive member 20 without being supported by the support column. In the present disclosure, the structure of the electrode of the first touch sensor and the second touch sensor may be a mutual-capacitance electrode structure as shown in FIG. 13. FIG. 13 is a schematic structural diagram of an electrode of a touch sensor according to the present disclosure. The structure of the electrode of the touch sensor includes a touch detection electrode 51 and a touch driving electrode 52. The touch detection electrode 51 includes multiple strip electrodes arranged in parallel. The touch driving electrode 52 includes multiple strip electrodes arranged in parallel. The multiple strip electrodes of the touch detection electrode 51 are perpendicular to the multiple strip electrodes of the touch driving electrode 52. The touch detection electrode 51 and the touch driving electrode 52 are located in different conductive layers, with an insulating layer between them.

It should be noted that the flexible display panel in the above embodiments is only an example of the OLED panel. It should be understood by those skilled in the art that the flexible display panel in the embodiments of the present disclosure may further be other types of display panels, such as liquid crystal display panel, or electronic paper. Accordingly, the conductive member may be a conductive structure arranged inside a flexible panel or between a flexible panel and a cover plate, such as an optical gap material with a conductivity in a liquid crystal panel, or a pixel electrode layer or a common electrode layer on a thin film transistor (TFT) substrate.

Figure 14:
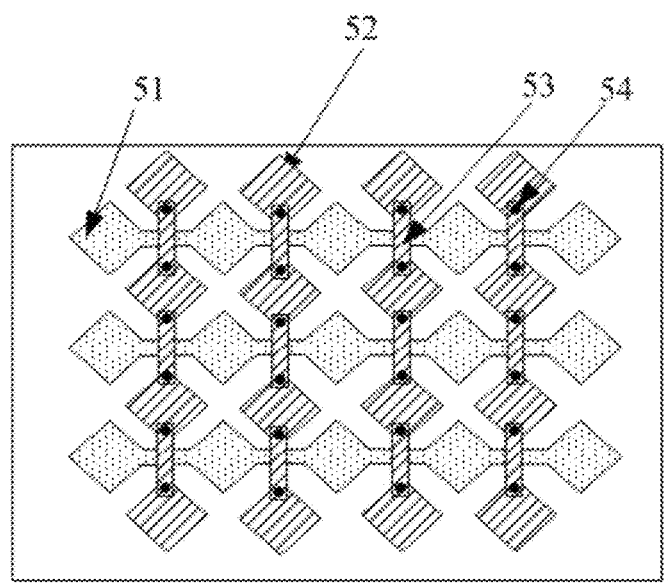
FIG. 14 is a schematic structural diagram of an electrode of a touch sensor according to the present disclosure.

In touch detection, the touch driving electrodes 52 input scanning signals sequentially, and a touch position is determined based on the output signals of the touch detection electrodes 51. In a case that the touch apparatus has the mutual-capacitance electrode structure, the structure of the electrode of the first touch sensor and the second touch sensor may also be as shown in FIG. 14. FIG. 14 is a schematic structural diagram of an electrode of a touch sensor according to the present disclosure. The touch detection electrode 51 includes multiple sub-electrodes arranged in parallel. Each of the multiple sub-electrodes includes multiple rhombic electrodes connected in series. All the sub-electrodes of the touch detection electrode 51 are located in a same conductive layer. The touch driving electrode 52 includes multiple sub-electrodes arranged in parallel. Each of the multiple sub-electrodes includes multiple rhombic electrodes connected in series via bridges 53 and via-holes 54. The rhombic electrodes of the touch driving electrode 52 are located in the same conductive layer as the sub-electrodes of the touch detection electrode 51. The bridges 53 and the rhombic electrodes of the touch driving electrode 52 are located in different conductive layers, and there is an insulating layer between the bridges 53 and the conductive layer. The touch detection principles in FIG. 14 are the same as that in FIG. 13, which will not be described herein.

Figure 15:
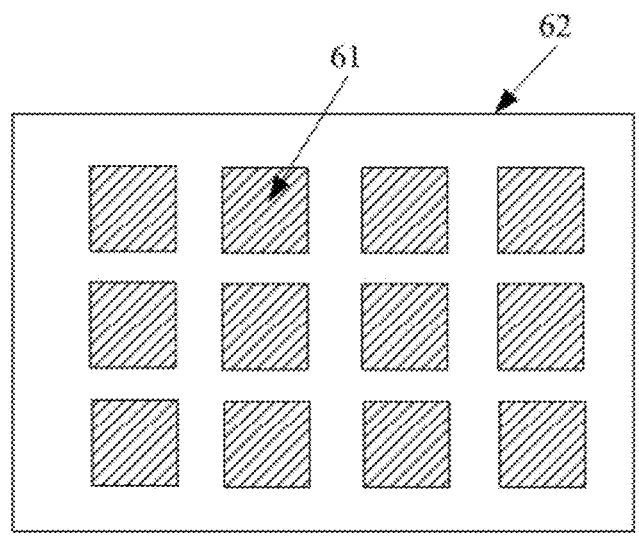
FIG. 15 is a schematic structural diagram of an electrode of a touch sensor according to the present disclosure.

In the present disclosure, the electrode structure of the first touch sensor and the second touch sensor may further be a mutual-capacitance electrode structure as shown in FIG. 15. FIG. 15 is a schematic structural diagram of an electrode of a touch sensor according to the present disclosure. The electrode structure of the touch sensor includes a detection electrode 61 and a reference electrode 62. The touch sensor includes multiple detection electrodes 61 arranged in an array. The detection electrode 61 and the reference electrode 62 are located in different conductive layers and are insulated with each other. In touch detection, the detection electrode 61 inputs a detection signal, and the touch position is detected based on the output signal of the detection electrode 61.

Figure 16:
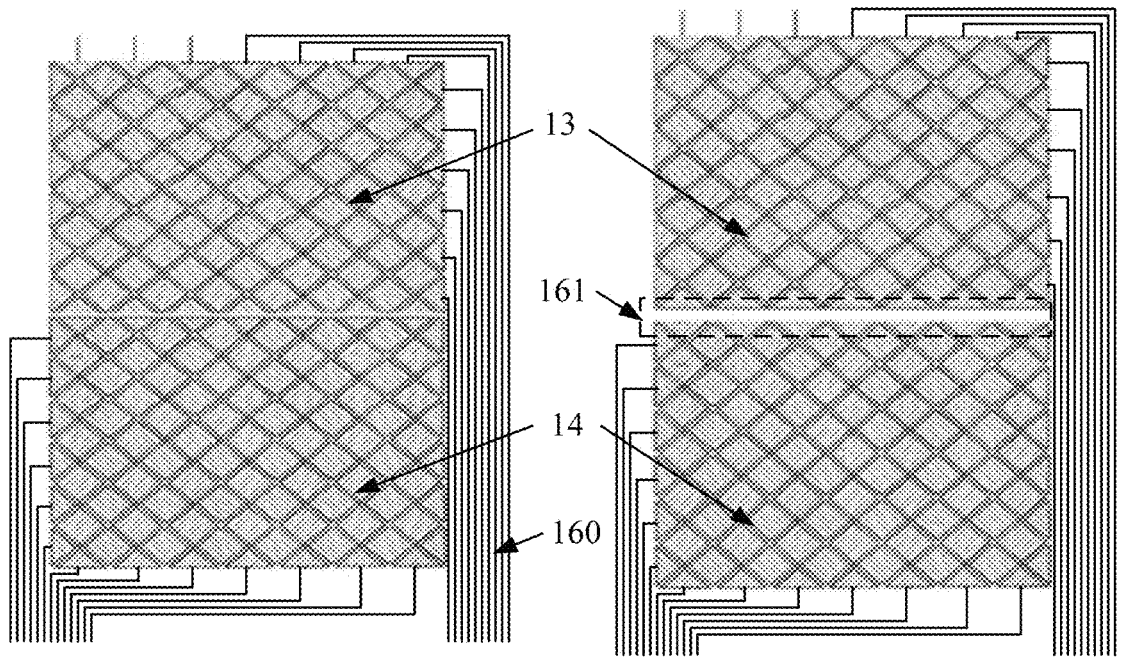
FIG. 16 is a schematic diagram of principles of a touch apparatus for reducing a touch dead zone according to the present disclosure.
Figure 17:
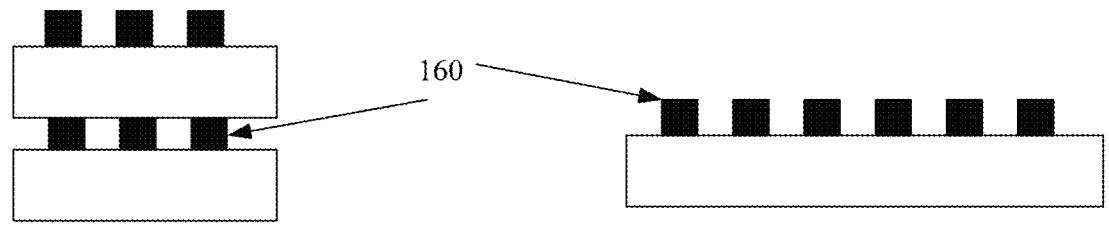
FIG. 17 is a schematic diagram of principles of a touch apparatus for achieving a narrow border according to the present disclosure.

Beneficial effects of the touch apparatus in various embodiments will be further described in conjunction with FIG. 16 and FIG. 17. FIG. 16 is a schematic diagram of principles of a touch apparatus for reducing a touch dead zone according to the present disclosure. FIG. 17 is a schematic diagram of principles of a touch apparatus for achieving a narrow border according to the present disclosure.

A touch apparatus according to an embodiment is shown in the left diagram of FIG. 16, in which the first touch sensor 13 and the second touch sensor 14 are arranged in different layers. In the right diagram of FIG. 16, the first touch sensor 13 and the second touch sensor 14 are arranged in the same layer.

As shown in the right diagram of FIG. 16, in a case that the first touch sensor 13 and the second touch sensor 14 are arranged in the same layer, a large gap 161 needs to be arranged between the first touch sensor 13 and the second touch sensor 14 for electrical insulation, which results in a large touch dead zone. As shown in the left diagram of FIG. 16, in the technical solutions according to the present disclosure, the first touch sensor 13 and the second touch sensor 14 are arranged in different layers. In such way, the first touch sensor 13 and the second touch sensor 14 may be completely or partially overlapped, or have a small gap in the second direction Z, leading to a small or zero touch dead zone.

As shown in FIG. 17, the left diagram of FIG. 17 is a schematic diagram of wire layout of a touch apparatus according to the present disclosure, and the right diagram of FIG. 17 is a conventional wire layout. In the present disclosure, by arranging the first touch sensor 13 and the second touch sensor 14 in different layers, wires 160 of the touch sensors are led out separately. In the second direction Z, the wires 160 corresponding to the first touch sensor 13 may be prepared in a separate conductive layer, and the wires 160 corresponding to the second touch sensor 14 may be prepared in a separate conductive layer, which significantly shortens the width occupied by the wires 160 and reduces the frame region.

In the above-described touch apparatus, the first touch sensor 13 may be formed on a surface of the cover plate towards the substrate. The second touch sensor 14 may be formed on a surface of the substrate towards the cover plate, and the substrate is attached to the cover plate. In addition, in other embodiments of the present disclosure, both the first touch sensor and the second touch sensor may be arranged on a same surface of the cover plate, a first insulating layer is arranged between the first touch sensor and the second touch sensor for electrical insulation, and the side of cover plate provided with the second touch sensor is attached to the substrate. Alternatively, both the first touch sensor and the second touch sensor may be arranged on a surface of the substrate, a first insulating layer is arranged between the first touch sensor and the second touch sensor for electrical insulation, and the side of the substrate provided with the first touch sensor is attached to the cover plate. It should be noted that, in the above embodiments, the first insulating layer may be a flexible transparent sheet, which can be attached to the first touch sensor, such as a polymer film, or an organic or inorganic insulating film which is deposited on the surface of the first touch sensor, or the second touch sensor in a subsequent process, which depends on specific situations, and is not limited in the present disclosure.

Figure 18:
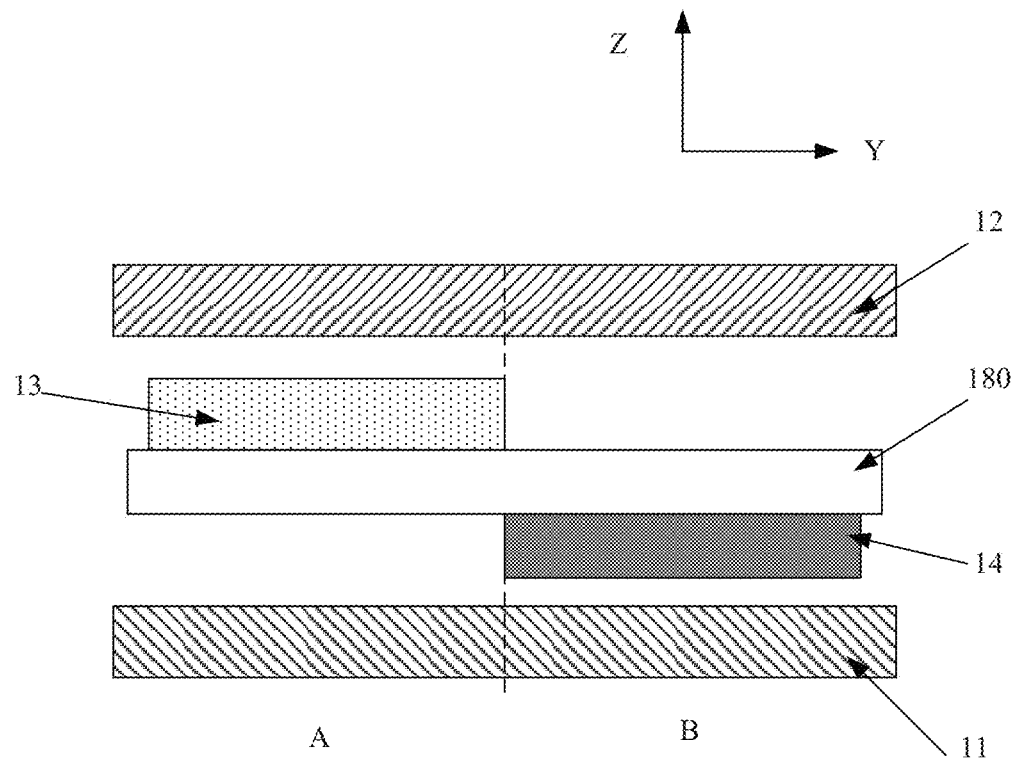
FIG. 18 is a schematic diagram of a result of a touch apparatus according to the present disclosure.

Reference is made to FIG. 18, which is a schematic diagram of a result of a touch apparatus according to the present disclosure. This touch apparatus differs from the embodiment as shown in FIG. 1 in that a flexible plate 180 is arranged between the first touch sensor 13 and the second touch sensor 14.

A touch panel with first touch sensor 13 and a touch panel with the second touch sensor 14 may be prepared separately, and the touch panels are attached to the cover plate 12 and the substrate 11, respectively. Alternatively, the first touch sensor 13 is formed on the cover plate 12, the flexible plate 180 is attached to the surface of the first touch sensor 13, the second touch sensor 14 is formed on the surface of the flexible plate 180 facing away from the first touch sensor 13, and the substrate 11 is attached to the surface of the second touch sensor 14. Alternatively, the second touch sensor 14 is formed on the substrate 11, the flexible plate 180 is attached to the surface of the second touch sensor 14, the first touch sensor 13 is formed on the surface of the flexible plate 180 facing away from the second touch sensor 14, and the cover plate 12 is attached to the first touch sensor 13.

In addition, it should be noted that the electrode structures of the first touch sensor and the second touch sensor in the present disclosure are not limited to the above-described mutual-capacitance electrode structure. In other embodiments, the electrode structures of the first touch sensor and the second touch sensor may also be a self-capacitance electrode structure, or one of the first touch sensor and the second touch sensor has the mutual-capacitance electrode structure, and the other has the self-capacitance electrode structure, which depends on specific situations, and is not limited in the present disclosure.

As described above, in the touch apparatus according to the present disclosure, the first touch sensor and the second touch sensor are arranged. In such way, when the touch apparatus is bent at the junction of the first display region and the second display region, the touch electrode can be prevented from being broken, which improves the service life. In addition, the first touch sensor is arranged in a different layer from the second touch sensor, and the wires of the first touch sensor may overlap the wires of the second touch sensor in the second direction, which facilitates the wire layout of the first touch sensor and the second touch sensor and saves wire space.

Figure 19:
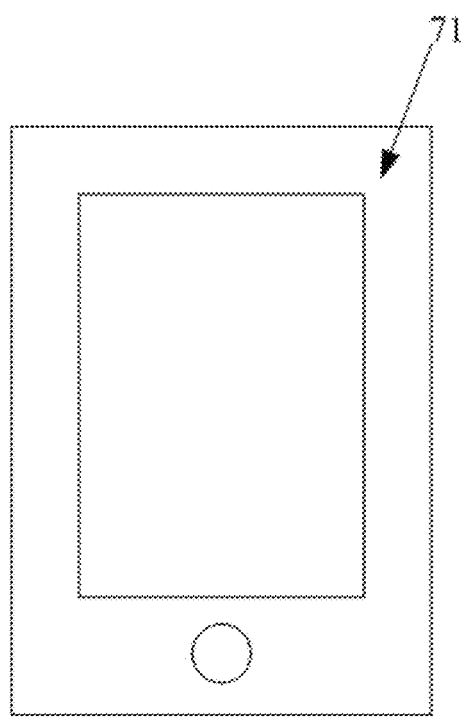
FIG. 19 is schematic structural diagram of an electronic device according to the present disclosure.
Figure 20:
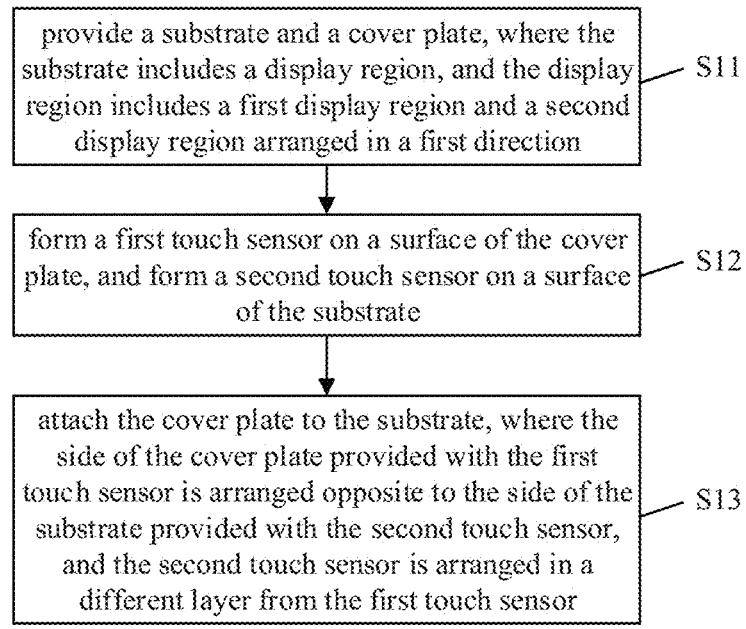
FIG. 20 is a schematic flow chart of a preparing method of a touch apparatus according to the present disclosure.

Based on the touch apparatus in the above embodiments, an electronic device is further provided according to the present disclosure. The electronic device is shown in FIG. 19, which is a schematic structural diagram of an electronic device according to the present disclosure. The electronic device includes a touch apparatus 71, and the touch apparatus 71 is the touch apparatus according to the above embodiments. The electronic device may be an electronic device with a touch display function, such as a mobile phone, a tablet computer, or a television. The above touch apparatus is adopted in the electronic device, which can prevent the touch electrode from being broken when bending the electronic device, thereby improving the service life. In addition, by arranging the first touch sensor and the second touch sensor in different layers, wires of the first touch sensor may overlap wires of the second touch sensor in the second direction, which facilitates the wire layout of the first touch sensor and the second touch sensor and saves wire space.

Based on the touch apparatus in the above embodiments, a preparing method is further provided according to the present disclosure to prepare the above touch apparatus. The preparing method includes steps S11 to S13.

In step S11, a substrate and a cover plate are provided. The substrate includes a display region, and the display region includes a first display region and a second display region arranged in a first direction.

In step S12, a first touch sensor is formed on a surface of the cover plate, and a second touch sensor is formed on a surface of the substrate.

In order to make the two touch sensors have the same transmittance and resistivity, step S12 includes: forming touch electrodes on the surfaces of the first touch sensor and the second touch sensor in a same process. Each of the touch electrodes includes a touch detection electrode and a touch driving electrode. The transmittance and the resistivity of the touch detection of the two touch sensors are the main factor affecting the transmittance and the resistivity of the first touch sensor and the second touch sensor. If the two touch sensors are prepared in different times and in different processes, the two touch sensors have a great difference in the transmittance and resistivity, which may affect the touch detection accuracy of the touch apparatus. Touch electrodes of the two touch sensors are prepared in the same process at the same time, which can avoid the difference in the touch electrodes of the two touch sensors.

Figure 21:
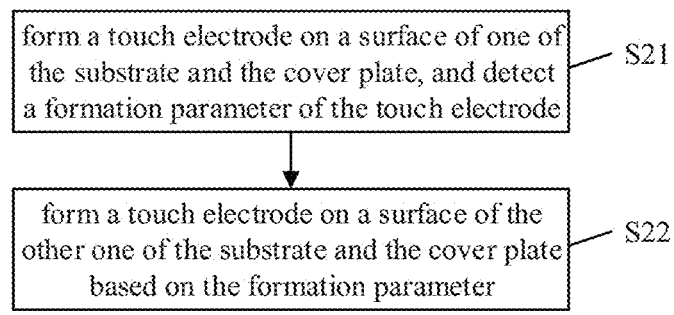
FIG. 21 is a schematic flow chart of a preparing method of a touch electrode according to the present disclosure.

The touch electrodes of the two touch sensors may also be prepared separately. In order to make the transmittance and resistivity of the touch electrodes of the two touch sensors the same, step S12 may further as shown in FIG. 21, which is a schematic flow chart of a preparing method of a touch electrode according to the present disclosure. The preparing method includes steps S21 and S22.

In step S21, a touch electrode is formed on a surface of one of the substrate and the cover plate, and a formation parameter of the touch electrode is detected.

In step S22, a touch electrode is formed on a surface of the other one of the substrate and the cover plate based on the formation parameter.

In FIG. 21, parameter monitoring is performed by taking the process of preparing the touch electrode of one of the first touch sensor and the second touch sensor as a master test pattern, and the touch electrode of the other one of the first touch sensor and the second touch sensor are prepared based on the parameter monitoring to ensure the consistency of the transmittance and the electrical parameters.

In step S13, the cover plate is attached to the substrate. The side of the cover plate provided with the first touch sensor is arranged opposite to the side of the substrate provided with the second touch sensor. The second touch sensor and the first touch sensor are in different layers.

The first direction is parallel to the substrate. The first touch sensor has a first projection on the substrate in a second direction, and the first projection covers the first display region. The second touch sensor has a second projection on the substrate in the second direction, and the second projection covers the second display region. The second direction is perpendicular to the substrate.

In the touch apparatus, each of the two touch sensors may be provided with an independent control chip. In this case, the preparing method further includes: electrically connecting a first control chip to the first touch sensor, and electrically connecting a second control chip to the second touch sensor.

The first control chip drives the first touch sensor to perform touch detection, and the second control chip drives the second touch sensor to perform touch detection, to reduce the touch error of the first touch sensor and the second touch sensor due to the relative height between the first touch sensor and the second touch sensor.

Figure 22:
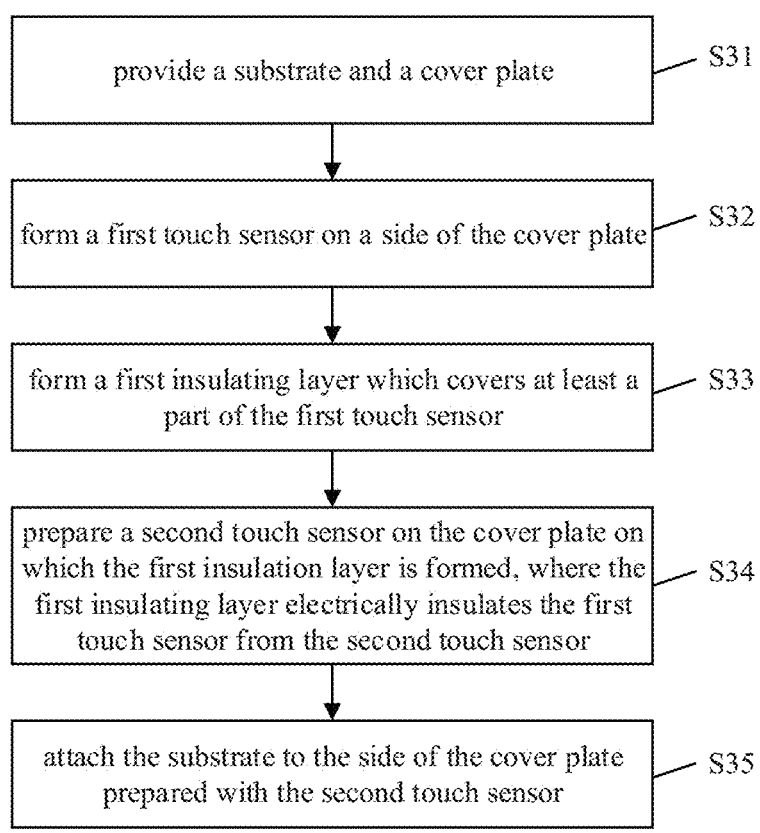
FIG. 22 is a schematic flow chart of a preparing method according to the present disclosure.

A preparing method is further provided according to the present disclosure. The preparing method includes is as shown in FIG. 22, which is a schematic flow chart of a preparing method according to the present disclosure. The preparing method includes steps S31 to S35.

In step S31, a substrate and a cover plate are provided.

In step S32, a first touch sensor is formed on a side of the cover plate.

In step S33, a first insulating layer is formed, which covers at least a part of the first touch sensor.

In step S34, a second touch sensor is prepared on the cover plate on which the first insulation layer is formed, where the first insulating layer electrically insulates the first touch sensor from the second touch sensor.

In step S35, the substrate is attached to the side of the cover plate prepared with the second touch sensor.

The first direction is parallel to the substrate. The first touch sensor has a first projection on the substrate in a second direction, and the first projection covers the first display region. The second touch sensor has a second projection on the substrate in the second direction, and the second projection covers the second display region. The second direction is perpendicular to the substrate.

In addition, for the structure of the touch apparatus as shown in FIG. 18, the preparing method may include: providing a flexible plate; forming a first touch sensor on one side of the flexible plate, and forming a second touch sensor on the other side of the flexible plate; attaching a cover plate to the side of the flexible plate arranged with the first touch sensor, and attaching a substrate to the side of the flexible plate arranged with the second touch sensor. The first direction is parallel to the substrate. The first touch sensor has a first projection on the substrate in a second direction, and the first projection covers the first display region. The second touch sensor has a second projection on the substrate in the second direction, and the second projection covers the second display region. The second direction is perpendicular to the substrate.

In other embodiments, to prepare the structure of the touch apparatus as shown in FIG. 18, the preparing method may include: forming a first touch sensor on a cover plate 12, attaching a flexible plate to the surface of the first touch sensor, forming a second touch sensor on the surface of the flexible plate facing away from the first touch sensor, and attaching a substrate to the surface of the second touch sensor, so as to complete the preparing of the touch apparatus. Alternatively, the preparing method may include: forming a second touch sensor on a substrate, attaching a flexible plate to the surface of the second touch sensor, forming a first touch sensor on the surface of the flexible plate facing away from the second touch sensor, and attaching a cover plate to the surface of the first touch sensor, so as to complete the preparing of the touch apparatus.

By preparing the above touch apparatus prepared with the preparing method according to the embodiment, when the touch apparatus is bent at the junction of the first display region and the second display region, the touch electrode can be prevented from being broken, which improves the service life. In addition, by arranging the first touch sensor in a different layer from the second touch sensor, wires of the first touch sensor may overlap wires of the second touch sensor in the second direction, which facilitates the wire layout of the first touch sensor and the second touch sensor and saves wire space. In addition, in the touch apparatus prepared with the preparing method, the touch electrodes of the two touch sensors have good consistency of transmittance and resistivity, ensuring a high detection precision of the touch apparatus.

Embodiments are described in a progressive manner and each embodiment places emphasis on the difference from other embodiments. Therefore, one embodiment can refer to other embodiments for the same or similar parts. Since the method disclosed in the embodiments corresponds to the apparatus disclosed in the embodiments, the description of the method is simple, and reference may be made to the relevant part of the apparatus.

According to the description of the disclosed embodiments, those skilled in the art can implement or use the technical solution. Various modifications made to these embodiments may be obvious for those skilled in the art, and the general principle defined in the present disclosure may be implemented in other embodiments without departing from the spirit or scope of the present disclosure. Therefore, the present disclosure is not limited to the embodiments described herein but confirms to a widest scope in accordance with principles and novel features disclosed in the present disclosure.

The invention claimed is:

1. A touch apparatus, comprising:
a substrate, comprising a display region, and the display region comprising a first display region and a second display region arranged in a first direction, wherein the touch apparatus is bendable along an axis, the axis is a boundary between the first display region and the second display region, and the boundary between the first display region and the second display region is a straight line;
a cover plate,
a first touch sensor formed on a surface of the cover plate, and
a second touch sensor formed on a surface of the substrate; wherein:
the cover plate is attached to the substrate, and a side of the cover plate provided with the first touch sensor is arranged opposite to a side of the substrate provided with the second touch sensor;
the first touch sensor is arranged on the side of the cover plate towards the substrate;
the second touch sensor is arranged on the side of the substrate towards the cover plate, and the second touch sensor is arranged in a different layer from the first touch sensor;
a projection of an edge of the first touch sensor on the substrate and a projection of an edge of the second touch sensor on the substrate overlap with each other at the axis;
the first direction is parallel to the substrate, the first touch sensor has a first projection on the substrate in a second direction, the first projection covers the first display region, the second touch sensor has a second projection on the substrate in the second direction, the second projection covers the second display region, and the second direction is perpendicular to the substrate;
the substrate is an OLED display panel, the first touch sensor and the second touch sensor are electrically connected to a same control chip via conductive wires arranged on the substrate, and the wires and an anode of the OLED display panel in a same conductive layer;
a conductive member is arranged between the substrate and the cover plate, the conductive member comprises a support column and a connection layer arranged on a surface of the support column, the connection layer and a cathode of the OLED panel are in another same conductive layer; and
the first touch sensor is connected to the wires via the connection layer.

2. The touch apparatus according to claim 1, wherein the first projection is located within the first display region, and the second projection is completely located within the second display region; and
the sum of the areas of the first projection and the second projection is equal to the area of the display region.

3. The touch apparatus according to claim 1, wherein the first projection is located within the first display region, and the second projection is located within the second display region; and
a gap with a preset width in the first direction exists between the first projection and the second projection.

4. The touch apparatus according to claim 3, wherein the width of the gap in the first direction is not greater than 10 µm.

5. The touch apparatus according to claim 1, wherein the first projection and the second projection have an overlapped part with a preset width in the first direction.

6. The touch apparatus according to claim 5, wherein the width of the overlapped part in the first direction is not greater than 10 µm.

7. The touch apparatus according to claim 1, further comprising a flexible display panel, wherein the flexible display panel is attached to the substrate.

8. The touch apparatus according to claim 1, wherein the substrate is a flexible display substrate comprising a plurality of pixel units arranged in an array.

9. The touch apparatus according to claim 1, wherein each of the first touch sensor and the second touch sensor is provided with an independent control chip.

10. The touch apparatus according to claim 9, wherein
the substrate further comprises a frame region surrounding the display region;
the control chip for the first touch sensor and the control chip for the second touch sensor are arranged in the frame region; and
the first touch sensor and the second touch sensor are electrically connected to the corresponding control chips through a flexible circuit board.

11. The touch apparatus according to claim 1, wherein the conductive member electrically connects the first touch sensor to the substrate.

12. The touch apparatus according to claim 11, wherein the conductive member is constituted by a cathode metal layer.

13. The touch apparatus according to claim 11, wherein the conductive member is conductive glue arranged between the substrate and the cover plate.

14. The touch apparatus according to claim 11, wherein the connection layer covers a side surface of the support column.

15. The touch apparatus according to claim 1, each of the first touch sensor and the second touch sensor comprises a touch detection electrode and a touch driving electrode.

16. An electronic device, comprising a touch apparatus, wherein the touch apparatus comprises:
a substrate, comprising a display region, and the display region comprising a first display region and a second display region arranged in a first direction, wherein the touch apparatus is bendable along an axis, the axis is a boundary between the first display region and the second display region, and the boundary between the first display region and the second display region is a straight line;
a cover plate,
a first touch sensor formed on a surface of the cover plate, and
a second touch sensor formed on a surface of the substrate; wherein:
the cover plate is attached to the substrate, and a side of the cover plate provided with the first touch sensor is arranged opposite to a side of the substrate provided with the second touch sensor;
the first touch sensor is arranged on the side of the cover plate towards the substrate;
the second touch sensor is arranged on the side of the substrate towards the cover plate, and the second touch sensor is arranged in a different layer from the first touch sensor;
a projection of an edge of the first touch sensor on the substrate and a projection of an edge of the second touch sensor on the substrate overlap with each other at the axis;
the first direction is parallel to the substrate, the first touch sensor has a first projection on the substrate in a second direction, the first projection covers the first display region, the second touch sensor has a second projection on the substrate in the second direction, the second projection covers the second display region, and the second direction is perpendicular to the substrate;
the substrate is an OLED display panel, the first touch sensor and the second touch sensor are electrically connected to a same control chip via conductive wires arranged on the substrate, and the wires and an anode of the OLED display panel in a same conductive layer;
a conductive member is arranged between the substrate and the cover plate, the conductive member comprises a support column and a connection layer arranged on a surface of the support column, the connection layer and a cathode of the OLED panel are in a same conductive layer and are made of a same material; and
the first touch sensor is connected to the wires via the connection layer.

* * * * *